United States Patent [19]
Baldino

[11] Patent Number: 5,010,449
[45] Date of Patent: Apr. 23, 1991

[54] MULTI-LAYER PRINTED CIRCUIT BOARD AND A METHOD FOR ASSURING ASSEMBLY IN A SELECTED ORDER

[75] Inventor: Robert L. Baldino, Spencerport, N.Y.

[73] Assignee: Eastman Kodak Company, Rochester, N.Y.

[21] Appl. No.: 504,466

[22] Filed: Apr. 4, 1990

[51] Int. Cl.$^5$ .............................................. H05K 1/11
[52] U.S. Cl. ..................................... 361/414; 361/412
[58] Field of Search ................. 40/576, 615; 116/200, 116/201; 361/399, 412, 413, 414, 419, 420; 434/159, 191, 195, 196, 205, 207

[56] References Cited

U.S. PATENT DOCUMENTS 4,461,107 7/1984 Grate .................... 40/576

FOREIGN PATENT DOCUMENTS 2511135 9/1976 Fed. Rep. of Germany ...... 361/399

Primary Examiner—Leo P. Picard
Assistant Examiner—Donald A. Sparks
Attorney, Agent, or Firm—Edward Dugas

[57] ABSTRACT

A method for assuring that a multi-layer circuit board has been assembled in a selected order which method incorporates the step of forming a label on each layer of the multi-layer circuit board, with each of the labels having a unique indicia thereon indicative of that layers position in a correctly assembled multi-layer circuit board. Additionally, there is provided the step of forming a transparent area in each layer above the last layer to be viewed, with the size of each transparent area limited to that necessary to view only the indicia of the following correctly assembled layers, such that an incorrectly ordered layer prevents the viewing of at least one indicia. A replication of the labels, commencing from the last ordered layer to the first ordered layer, provides for a doubling in the number of layers that can be checked for correct assembly order.

11 Claims, 2 Drawing Sheets

MULTI-LAYER PRINTED CIRCUIT BOARD AND A METHOD FOR ASSURING ASSEMBLY IN A SELECTED ORDER

TECHNICAL FIELD OF THE INVENTION

The present invention relates to the field of multi-layer printed circuit boards and more particularly, to circuit boards having an indicia there on for assuring correct assembly.

BACKGROUND OF THE INVENTION

As is well known, multilevel printed circuit boards carry conductive runs on their surfaces with terminations that are drilled to accept either plating such as in a plated through hole or to accept pin conductors from cables or other discrete devices. In order to assure the proper interconnection of these electrical conductors the alignment of each of the layers must be within some preselected assembly tolerance.

In R. Brabetz U.S. Pat No. 4,432,037 entitled, "MULTI-LAYER PRINTED CIRCUIT BOARD AND METHOD FOR DETERMINING THE ACTUAL POSITION OF INTERNALLY LOCATED TERMINAL AREAS" there is disclosed a method which uses a probe for determining the amount of skew or distortion that has taken place in the layers during the assembly and pressing operation prior to drilling the plated through hole connections. If the order of the layers is not correct this method will not be able to detect the mis-order.

Another patent of interest for its teachings is R. E. Braun et al. U.S. Pat. No. 4,510,446 entitled, "TEST COUPONS FOR DETERMINING THE REGISTRATION OF SUBSURFACE LAYERS IN A MULTI-LAYER PRINTED CIRCUIT BOARD". In that patent, the internal registration of the various layers is checked by inserting a conductive probe through a series of plated through holes. By making some of the holes with different diameters it can be determined when the layers with these holes are misaligned past an acceptable tolerance because the conductive probe will sense the metal contact on the inner walls of the hole causing a change in current flow from the probe through the conductors connected to the plated through hole or a change in the resistance values sensed by the probe. As well as this system works for determining the registration of the layers it cannot determine the order of the layers.

Still another patent of particular interest is R. F. Benson U.S. Pat. No. 4,536,239 entitled, "MULTI-LAYER CIRCUIT BOARD INSPECTION SYSTEM". In that patent there is disclosed a system for verifying the registration between layers of a multi-level circuit board during assembly. The method uses two identical patterns on at least two layers. The alignment of these two patterns is viewed relative to a test pattern via radiography techniques. This particular method also will not be able to determine if one or more of the layers of the multi-layer board are in the wrong order.

The sequential order of assembly of multi-level circuit boards is important because an incorrect order can change the impedance between layers, the designed capacitance between layers, and the proper thicknesses between layers. These requirements are above and beyond conductivity checks, which only test DC performance. A multi-layer printed circuit board can pass a conductivity test but be unreliable or useless at the frequencies it was designed to operate at due to improper order of assembly of its layers.

SUMMARY OF THE INVENTION

In the present invention, each layer of a multi-layer printed circuit board is provided with a label specific to that layer. No two layers will contain the same label. The labels are arranged in an order which corresponds to the order of correct assembly of each layer of the printed circuit board. An incorrect order of assembly would leave one or more labels missing when inspected from the top or bottom of the assembled boards.

From the foregoing it can be seen that it is a primary object of the present invention to provide an improved method and multi-layer circuit board for determining the assembled sequence of the multi-layer circuit board.

It is another object of the present invention to provide a method for viewing the sequence of assembly of a multi-layer printed circuit board.

It is a further object of the present invention to provide a method for inspecting a printed circuit board, either from the top or from the bottom, in order to determine the order of assembly of the layers of the board.

These and other objects of the present invention will become more apparent when taken in conjunction with the following description and drawings wherein like characters indicate like parts and which drawings form a part of the present invention.

DESCRIPTION OF THE PREFERRED EMBODIMENTS

Figure 1:
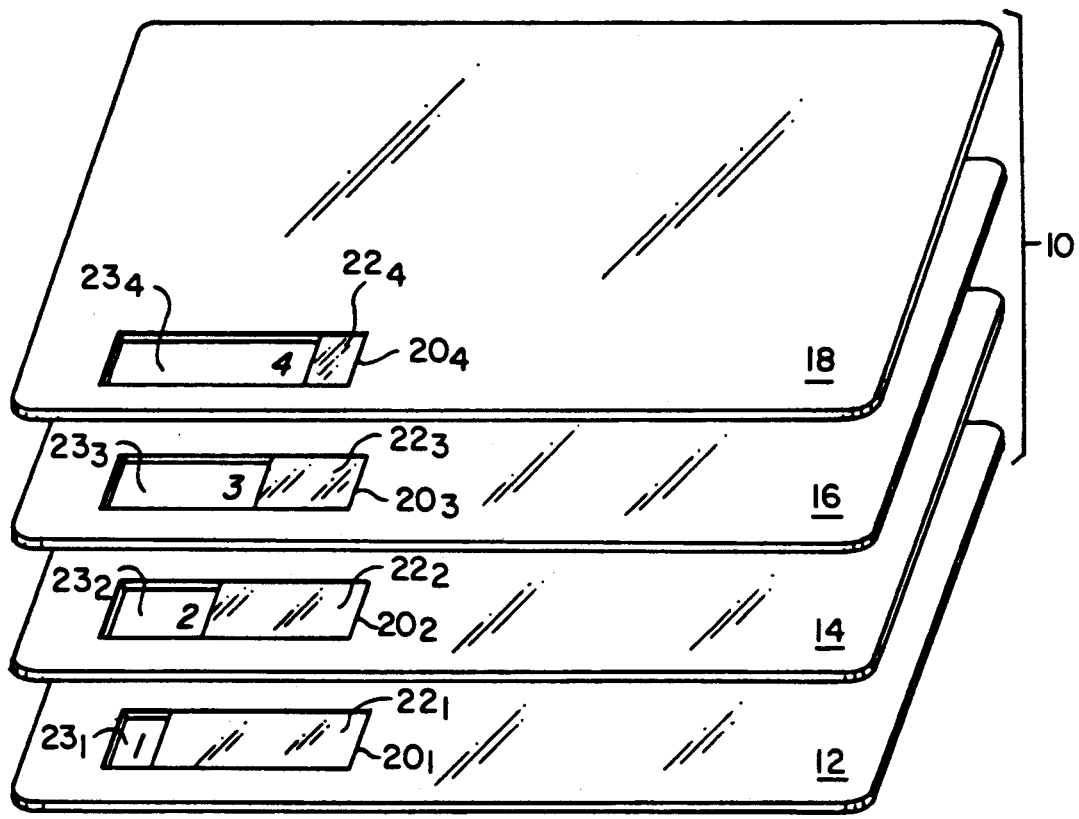
FIG. 1 is an exploded view of a 4-layer board incorporating the present invention.

FIG. 1 illustrates in an exploded view, a circuit board 10, having four layers 12, 14, 16, and 18. Although only four layers are shown, this is by way of example only, and more or less layers may be used based on the present teaching. Positioned over each other, on each of the boards, is a label $20_1$ through $20_4$. Each label has an identifying mark, such as a number, which is unique to the layer to which it is affixed. The identifying marks (indicia) are staggered so that they can all be viewed in a selected order when the layers have been assembled in a correct order. The selected order shown in FIG. 1 is "1, 2, 3, and 4". Opaque masks, $22_1$ through $22_4$, are positioned directly after the indicia on each layer to block the viewing of any indicia that may be positioned directly below each mask. The opaque mask and the indicia may be formed with a metallization layer. Each mask is provided with a transparent or semi-transparent area denoted $23_1$ through $23_4$. These areas are positioned directly above each other and increase in size so as to permit correctly ordered labels positioned below to be viewed through these transparent areas.

Figures 2, 3A, 3B:
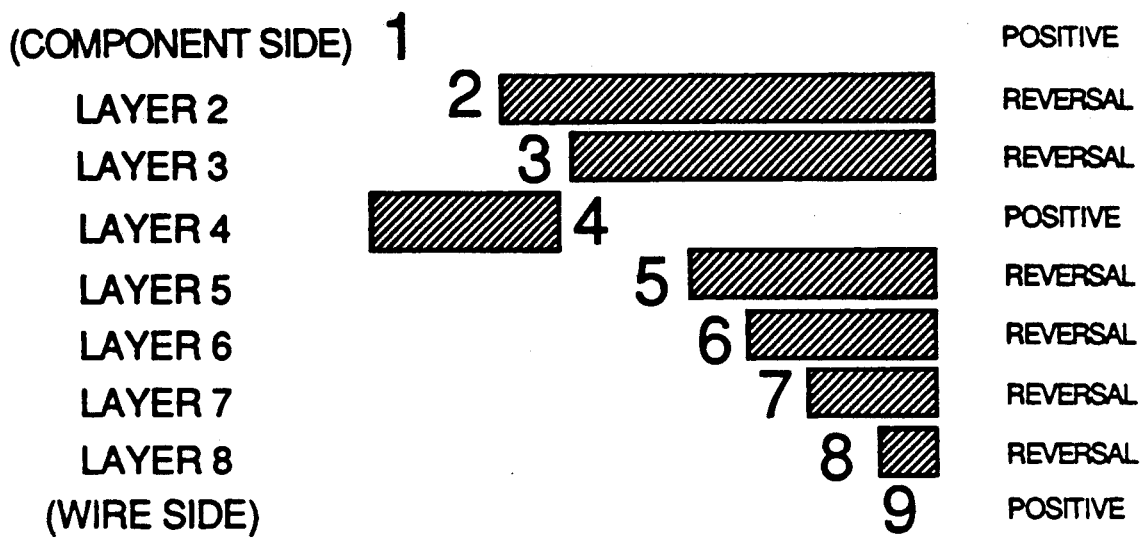
FIG. 2 is a chart illustrating the labeling for a 9-layer board.
FIGS. 3A and 3B are inspection views of the labels from the top of the board and from the bottom of the board, respectively.

Referring to FIG. 2, the label configuration for a nine-layer board is shown with the numbering starting at 1 from the component side. Layer 2 has a mask which is opaque in the area following the number 2 (to the right). In a like manner, layers 3, 5, 6, 7, and 8 have the opaque areas after their respective numbers. To be noted is that layers 1, 4, and 9 are designated positive while the remainder are designated reversal. Areas on a positive layer that contain no objects would remain transparent, whereas areas on a reversal layer that contain no objects would remain opaque.

FIG. 3A is an example of a top view down from the top side of the multi-layer board showing the exposed indicia (numbers) for a correctly assembled board of nine-layers. FIG. 3B illustrates an example of the view from the bottom side of the same board. This view only assures that the last two layers have been assembled correctly.

If any layer is installed incorrectly, either its label will be blocked out by the metal window of other layers that should be below it or its metal window will block out the indicia of other layers that should be above it. If multiple assembly errors are made, the exact determination of the wrong assembly order might not be possible, but there still will be blocked labels providing evidence that the board was assembled incorrectly.

The only limitation of the present method is the number of layers of semi-transparent fiberglass through which layer indicia can be recognized or sensed. The method may also be applied from the bottom side. If this is done from the top as well, twice the number of layers can be verified.

The present invention provides a fail safe way that an inspector or sensor could determine whether a printed circuit board was manufactured with the correct layer order prior to being populated with discrete components thus saving assembly time, cost of components and troubleshooting time.

These layers, if labeled in a clear manner and specified to the printed circuit board manufacturer, could also be used as an assembly guide to avoid costly printed circuit board manufacturer errors and rejected printed circuit boards.

While there has been shown what is considered to be the preferred embodiment of the invention, it will be manifest that many changes and modifications may be made therein without departing from the essential spirit of the invention. It is intended, therefor, in the annexed claims, to cover all such changes and modifications as may fall within the true scope of the invention.

In the claims:

1. A method for assuring that a multi-layer circuit board has been assembled in a selected order comprising the steps of:
   forming a label on each layer of the multi-layer circuit board, with each label having a unique indicia thereon indicative of that layers position in a correctly assembled multi-layer circuit board;
   forming a semi-transparent area in each layer above the last layer to be viewed, with the size of each semi-transparent area limited to that necessary to view only the indicia of the correctly assembled layers positioned below that particular layer, such that an incorrectly positioned layer prevents the viewing of at least one indicia; and
   viewing the assembled multi-layer circuit board to assure the order of said unique indicia.

2. The method according to claim 1 wherein the steps are repeated in the same order starting from the last ordered layer in the multi-layer circuit board and going to the first ordered layer, such that the order of the indicia can be viewed from the top or from the bottom of the multi-layer board.

3. The method according to claim 1 wherein the steps are repeated in the same order starting from the outermost layers and progressing to a central layer, such that the order of the indicia can be viewed from the top and from the bottom of the multi-layer board, thereby increasing the number of viewable indicia.

4. The method according to claim 1, wherein the indicia is selected to be a pattern that is machine sensible.

5. A method for assuring that a multi-layer circuit board has been assembled in a selected order comprising the steps of:
   providing each layer of the multi-level circuit board with at least one indicia of a sequence of indicia that is related to its layers order in a correctly assembled circuit board with each indicia being staggered in position from the indicia on the other layers;
   providing a semi-transparent viewing area adjacent each indicia which viewing area is limited in size so as to only permit the viewing of the staggered indicia located below the viewing area when each layer is in the correct assembly order; and
   viewing said sequence of indicia through the semi-transparent viewing area to determine if the sequence corresponds to that of a correctly assembled multi-level circuit board.

6. The method according to claim 5, wherein the indicia is selected to be a pattern that is machine sensible.

7. A multi-level printed circuit board comprising:
   a plurality of circuit board layers each to be joined to the others in a selected assembly order;
   an indicia affixed to each circuit board layer uniquely indicative of the order of the layer in a correctly assembled circuit board such that each indicia is viewable; and
   means for blocking the indicia of one or more layers if mis-ordering of the layers takes place.

8. The multi-level printed circuit board of claim 7 wherein said means for blocking is comprised of:
   an opaque area adjacent each indicia and located under all indicias to be viewed from above that layer such that if the layer is placed above its specified position, it will prevent viewing of the indicias of at least one layer.

9. The multi-level printed circuit board of claim 8, wherein each opaque area is formed of a metallization area.

10. The multi-level printed circuit board of claim 7, wherein each indicia is a number, the sequence of which indicates the selected order of correctly assembled layers.

11. The multi-level printed circuit board of claim 7, wherein each indicia is a pattern that is machine sensible.

* * * * *